US009479208B2

(12) United States Patent
Papotto et al.

(10) Patent No.: US 9,479,208 B2
(45) Date of Patent: Oct. 25, 2016

(54) SYSTEM FOR THE CORRECTION OF THE PHASE ERROR OF TWO IN-PHASE AND QUADRATURE SIGNALS, CORRESPONDING DEVICE AND METHOD

(71) Applicant: STMICROELECTRONICS S.r.l., Agrate Brianza (IT)

(72) Inventors: Giuseppe Papotto, Biancavilla (IT); Giuseppe Palmisano, s.Giovanni la Punta (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 14/751,470

(22) Filed: Jun. 26, 2015

(65) Prior Publication Data

US 2016/0094256 A1    Mar. 31, 2016

(30) Foreign Application Priority Data

Sep. 30, 2014 (IT) .............................. TO2014A0780

(51) Int. Cl.
*H03C 3/00* (2006.01)
*H03M 3/00* (2006.01)
*H04B 1/16* (2006.01)
(Continued)

(52) U.S. Cl.
CPC ........ *H04B 1/16* (2013.01); *H03F 3/24* (2013.01); *H03K 5/1565* (2013.01); *H04L 27/364* (2013.01); *H04W 56/005* (2013.01); *H04W 56/0035* (2013.01)

(58) Field of Classification Search
CPC .......... H04B 1/04; H04B 15/00; H04B 7/01; H04B 1/1036
USPC ........................................... 375/302; 341/143
See application file for complete search history.

(56) References Cited

U.S. PATENT DOCUMENTS 5,270,666 A * 12/1993 Rapeli .................... G01R 23/10
329/341
5,375,258 A    12/1994 Gillig
(Continued)

FOREIGN PATENT DOCUMENTS

WO        0124358 A1    4/2001

OTHER PUBLICATIONS

Yu et al., "A Novel Adaptive Mismatch Cancellation System for Quadrature IF Radio Receivers," IEEE Transactions on Circuits and Systems—II. Analog and Digital Signal Processing, vol. 46, No. 6, Jun. 1999, pp. 789-801.

(Continued)

*Primary Examiner* — Daniel Washburn
*Assistant Examiner* — Sarah Hassan
(74) *Attorney, Agent, or Firm* — Allen, Dyer, Doppelt, Milbrath & Gilchrist, P.A.

(57) ABSTRACT

A system for correction of the phase error in in-phase and quadrature signals may include a first signal and a second signal. The system includes a first circuit and a second circuit, each circuit configured for receiving a square-wave input signal and supplying a respective square-wave output signal. The output signal is delayed with respect to the input signal and each circuit is configured in such a way that the propagation delay of a rising edge and the propagation delay of a falling edge between the input signal and the output signal are configurable. The first circuit is configured for receiving the first signal, and the second circuit is configured for receiving the second signal.

23 Claims, 7 Drawing Sheets

(51) Int. Cl.
*H04W 56/00* (2009.01)
*H04L 27/36* (2006.01)
*H03F 3/24* (2006.01)
*H03K 5/156* (2006.01)

(56) References Cited

U.S. PATENT DOCUMENTS

| | | | | |
|---|---|---|---|---|
| 5,610,954 A * | 3/1997 | Miyashita | ............... | H03K 5/133 327/157 |
| 7,110,435 B1 * | 9/2006 | Sorrells | ................ | H03D 7/00 375/147 |
| 8,325,865 B1 * | 12/2012 | Rofougaran | ........... | H04B 1/001 375/316 |
| 2001/0038674 A1 * | 11/2001 | Trans | ................ | H04B 1/00 375/355 |
| 2003/0227983 A1 * | 12/2003 | Milne | ................ | H04L 27/364 375/302 |
| 2005/0007168 A1 | 1/2005 | Park et al. | | |
| 2006/0033591 A1 * | 2/2006 | Kim | ................ | H03K 5/2472 331/185 |
| 2006/0038710 A1 * | 2/2006 | Staszewski | ............... | H03F 3/24 341/143 |
| 2008/0298495 A1 * | 12/2008 | Salvi | ................ | H04L 27/364 375/295 |
| 2010/0039157 A1 | 2/2010 | Kaeriyama et al. | | |
| 2011/0200161 A1 * | 8/2011 | Tasic | ................ | H03K 21/08 377/48 |

OTHER PUBLICATIONS

Valero-Lopez et al., "Self-Calibrated Quadrature Generator for WLAN Multistandard Frequency Synthesizer," IEEE Journal of Solid-State Circuits, vol. 41, No. 5, May 2006.
Steila, "Automatic In-phase Quadrature Balancing AIQB," Oct. 2006, pp. 1-9.
Navid et al., "Level-Locked Loop, A Technique for Broadband Quadrature Signal Generation," IEEE Custom Integrated Circuits Conf. (CICC), May 1997, pp. 411-414.
Nonis et al., "A Design Methodology for MOS Current-Mode Logic Frequency Dividers," IEEE Transactions on Circuits and Systems—I: Regular Papers, vol. 54, No. 2, Feb. 2007, pp. 245-254.
Ippolito et al., " A CMOS Auto-Calibrated I/Q Generator for Sub-GHz Ultra Low-Power Transceivers," IEEE Radio Frequency Integrated Circuits (RFIC) Symp., Jun. 2011, pp. 31-3222.
Kulkarni et al., "Design of an Optical Layout Polyphase Filter for Millimeter-Wave Quadrature LO Generation," IEEE Transactions on Circuits and Systems—II: Express Briefs. vol. 60, No. 4, Apr. 2013, pp. 202-206.

* cited by examiner

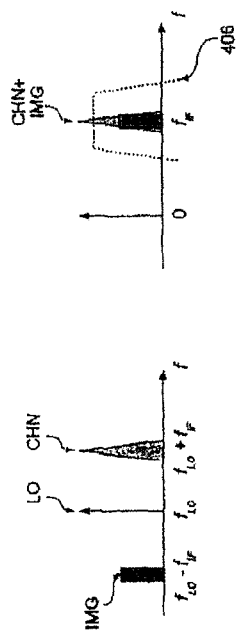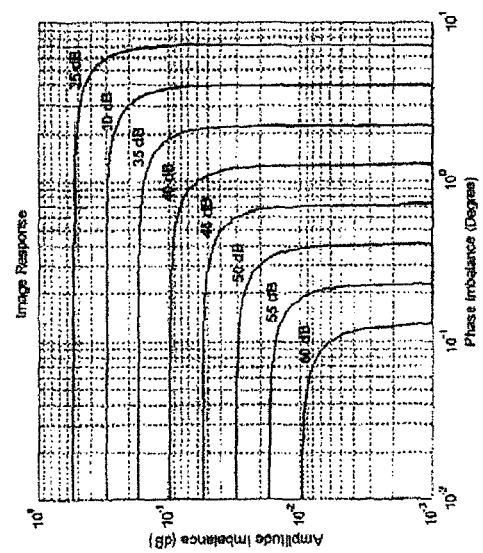

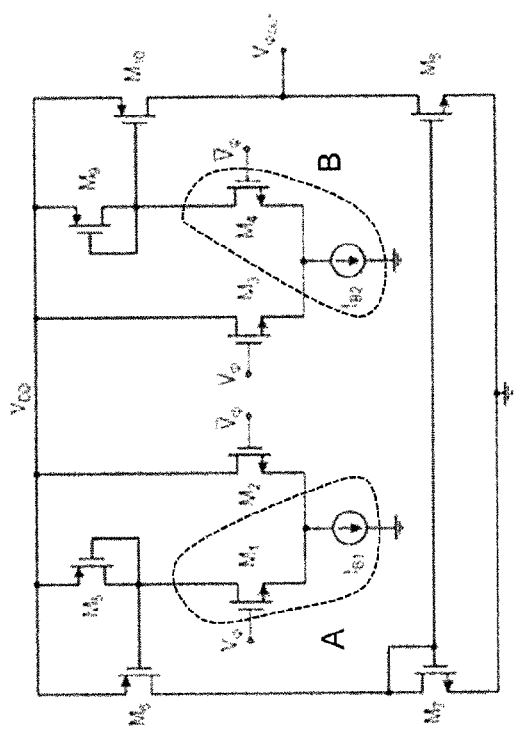
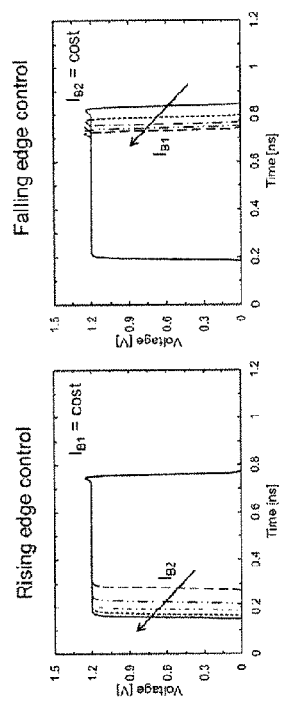
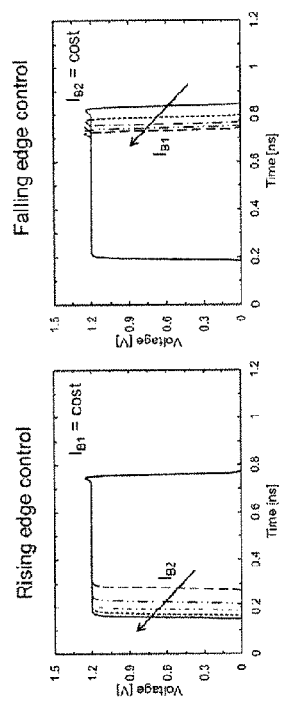
Fig. 8
Fig. 9a
Fig. 9b

SYSTEM FOR THE CORRECTION OF THE PHASE ERROR OF TWO IN-PHASE AND QUADRATURE SIGNALS, CORRESPONDING DEVICE AND METHOD

RELATED APPLICATION

This application is based upon prior filed copending Italian Application No. TO2014A000780 filed Sep. 30, 2014, the entire subject matter of which is incorporated herein by reference in its entirety.

TECHNICAL FIELD

The present disclosure relates to generating in-phase and quadrature signals (I/Q) in wireless receivers.

BACKGROUND

FIG. 1 shows a block diagram of a generic wireless transceiver, in which a processing circuit 10, such as, for example, a digital signal processor (DSP), supplies a baseband (EB) transmitting signal $TX_{BB}$. The above baseband transmitting signal TXBB is converted by a transmitter circuit 20 into a radio frequency (RF) transmitting signal TXRF. For instance, typically this transmitter circuit 20 comprises a modulator, such as, for example, a mixer or an analog multiplier, which modulates the signal TXBB with a high-frequency carrier signal LO. In addition, this transmitter circuit may also comprise filters, amplifiers, etc. Finally, the transmitting signal TXRF is sent to at least one antenna 30.

In a complementary way, an RF receiving signal RXRF received via the antenna 30 is converted via a receiver circuit 40 into a baseband receiving signal RXBB. For instance, typically this receiver circuit 40 comprises a demodulator, such as, for example, a mixer, which demodulates the signal RXRF using the carrier frequency LO. Also the receiver circuit may comprise filters, amplifiers, etc. For instance, the carrier signal LO may be supplied by an oscillator or synthesizer 50.

A particular architecture of the receiver 40 is the architecture of a so-called "low-intermediate frequency (low-IF)" type. Basically, in a low-IF receiver, the RF signal RXRF received is demodulated at a lower, non-zero, frequency, the so-called "intermediate frequency", which typically may range from hundreds of kilohertz (kHz) to some Megahertz (MHz).

Receivers with a low-IF architecture are commonly used in transceiver systems on account of their relatively low complexity and their robustness. The main characteristic of this architecture may comprise the fact that the RF signal RXRF received is converted by means of a system of a heterodyne type to a significantly lower frequency, hereinafter designated by fIF. In particular, the heterodyne system is implemented through a mixer that carries out multiplication of the radio frequency signal by an ideally pure tone (LO) with frequency fLO, appropriately generated by the synthesizer 50 in such a way that:

$$f_{IF} = f_{RF} - f_{LO}. \quad (1)$$

The high-frequency components generated by the multiplication can be subsequently filtered along the receiving chain. The choice of the frequency fIF has a considerable effect on the design of the analog system in so far as, if it is sufficiently high, it enables reduction of the problems of flicker noise and DC offsets generated by the chain of receiver circuits. On the other hand, an excessive increase of the frequency fIF may lead to an increase of the power dissipation of the analog-to-digital converter (ADC) and also of the digital signal processor (DSP) in so far as it requires a higher operational frequency.

Low-IF receivers normally use in-phase and quadrature signals (i.e., of a complex-envelope type) both to facilitate demodulation thereof and to solve the problem of image rejection. The in-phase and quadrature signals are periodic waveforms that have a phase difference equal to one quarter of their period, namely, 90°.

Consequently, as shown in FIG. 2, the low-IF receiver circuit 40 receives at input the radio frequency receiving signal RXRF. In the example considered, this signal is amplified via an amplifier 402, such as, for example, a low-noise amplifier (LNA).

In particular, in the case where the receiver 40 operates with signals I and Q that are in quadrature with respect to one another, the amplified signal, i.e., the signal at output from the amplifier 402, is sent to two branches: a first branch for the in-phase component I and a second branch for the quadrature component Q. In this case, each branch comprises a demodulator 404, such as, for example, a mixer, which carries out multiplication of the radio frequency signal by respective signals LOI and LOQ, and a filter 406, which, by filtering the high-frequency components, yields the evolution in time of the respective component IRX and QRX. To interface those signals with the processing circuit 10, respective analog-to-digital (A/D) converters 408 may be provided.

Consequently, reception of a complex signal calls for generation, upstream, of the in-phase signal LOI and the quadrature signal LOQ, namely, signals that have a phase shift of 90° with respect to one another. Generation of the tones LOI and LOQ with controlled phase shift may call for an accurate design of the circuit 50 that may limit as far as possible the inevitable cumulative phase errors.

The techniques normally employed envision use of synthesizers based upon PLLs containing an oscillator, such as, for example, a voltage-controlled oscillator (VCO) 502, and polyphase filters or frequency dividers 504. The latter approach, however, envisions generation of a tone by the synthesizer, the frequency of which should be at least twice the desired one.

Working against this disadvantage, the approach based upon dividers may enable generation of in-phase and quadrature signals over a wide range of frequencies, unlike the approach based upon polyphase filters, which are intrinsically narrowband filters. The precision on the amplitude and phase of the in-phase and quadrature signals I and Q may be important in RF communication systems that adopt the low-IF architecture, since it affects the levels of performance of the receiver in terms of bit-error rate (BER). The low-IF architecture presents in fact an image signal that may be very close to the channel of interest and that hence may require use of two in-phase and quadrature signals for implementing rejection of the image signal.

A typical problem of the low-IF receiver may be the so-called "image response or rejection." With reference to FIG. 3a, the problem includes that a generic heterodyne system produces a frequency conversion both of the desired channel CHN, in this case at a frequency fCHN=fLO+fIF, and of its image IMG positioned at fIMG=fLO−fIF, which at this point cannot be rejected with a classic real analog filter, such as, for example the filter 406. This is in so far as both of the channels are brought to the frequency fIF, since the components CHN and IMG are superimposed during demodulation in the demodulators 404 (see FIG. 3*b*).

Image rejection, as well as selection of the channel CHN, may in any case be made by complex-filtering techniques, which can be implemented either in an analog or in a digital way and operate on the complex (in-phase and quadrature) signal received by selecting the desired channel CHN from the image IMG and from other possible out-of-band interfering signals. The effectiveness of the complex filter in rejection of the image IMG is, however, markedly affected by the phase and amplitude mismatch or errors that accumulate on the in-phase and quadrature signals at input. Here, the phase mismatch is defined as the deviation with respect to the 90° phase shift expected between the signals I and Q, and the amplitude mismatch is defined as the lack of amplitude correspondence between the signals I and Q.

FIG. 4 shows a typical relation for image rejection (IR) with respect to the phase mismatch, or "Phase Imbalance", as appears on the horizontal axis, and the amplitude mismatch, or "Amplitude Imbalance", as appears on the vertical axis. The errors of the in-phase and quadrature signals I and Q are correlated to the image-rejection (IR) ratio.

The image-rejection ratio is described, for example, in the paper by Q. Gu, "RF System Design of Transceivers for Wireless Communications," New Work, USA, Springer, 2005. The relation that expresses the image rejection IR with respect to the phase mismatch $\varphi$ and the amplitude mismatch $\delta$ may be expressed via the following equation:

$$IR = 10 \log \frac{1 + 2(1+\delta)\cos\varphi + (1+\delta)^2}{1 - 2(1+\delta)\cos\varphi + (1+\delta)^2}; \quad (2)$$

where $\delta$ is the amplitude error (expressed in decibels) and $\varphi$ is the phase error with respect to the ideal 90° phase shift between the two signals I and Q.

From Eq. (2) it emerges that rejection of the image is increased when the amplitude error ($\delta$) and quadrature error ($\varphi$) are decreased. Specifically, a phase error ($\varphi$) of 0.2° makes it possible to obtain a rejection IR of 50 dB without requiring excessively stringent specifications on the amplitude error ($\delta$<0.03 dB). Consequently, normal techniques for correction of the errors are introduced in such a way as to maximize the image rejection available according to the specifications of the system and to the effective selectivity of the complex filter.

For instance, the technique described in Li Yu, W. Martin Snelgrove, "A Novel Adaptive Mismatch Cancellation System for Quadrature IF Radio Receivers," IEEE TRANSACTIONS ON CIRCUITS AND SYSTEMS-II: ANALOG AND DIGITAL SIGNAL PROCESSING, VOL. 46, NO. 6, JUNE 1999, is used because it operates digitally on the complex signal received, producing a simultaneous correction of amplitude and phase mismatch prior to complex filtering.

Alternatively, the technique described in Oscar Steila, "Automatic In-phase Quadrature Balancing AIQB", October 2006 (Rev C: Jul. 10, 2012) may be used, where a mismatch correction is made by correlating appropriately different harmonic contributions of the signal received. This approach calls, however, for an operation of Fast Fourier Transform (FFT), which is typically more burdensome from the computational standpoint. However, the increasing demand for low-consumption systems may clash with the need of producing high-performance ADC circuits, which in general prove particularly burdensome from the consumption standpoint and frequently force the digital circuitry to operate at higher sampling frequencies, thus weighing even more heavily on the power budget.

Optimization of the circuits and appropriate distribution of the functions linked to selection of the channel CHN within the low-IF architecture may, however, contribute significantly to the reduction of the overall consumption of the system, reducing in particular the performance required of the ADC and the digital circuitry. In this sense, the architecture in FIG. 5 contemplates the presence of a complex filter 412 of an analog type upstream of the A/D conversion. The complex filter 412 is ideally able to select the desired channel CHN from any other interfering channel (including the image IMG), intrinsically limiting the band requirement and the resolution of the ADC and hence also the consumption of the processing unit 10. Elimination of the image channel IMG may enable for some specific modulation formats demodulation of the channel received without necessarily having a complex signal, and consequently it is possible to eliminate also one of the two A/D converters 408.

Working against these advantages may be the problem of correction of the phase and amplitude errors at input to the complex filter 412. Due to the presence of the filter and of an A/D converter with limited performance, it is not possible to use the techniques disclosed by Yu et al. and Steila.

Working an these example of FIG. 5, it is disclosed to correct possible phase errors by acting appropriately at the level of the signal LO, for example, on the frequency dividers (circuit 504), and on the amplitude error at the baseband level, for example, by adding a respective amplifier with configurable amplification coefficient 410 between the filter 406 and the filter 412. In general, the simplest generators of in-phase and quadrature signals are systems that exploit open-loop approaches, such as, for example, polyphase passive filters or frequency dividers in the master-slave configuration, as in FIGS. 6*a* and 6*b*.

For instance, the technique described in S. Kulkarni, D. Zhao, and P. Reynaert, "Design of an optimal layout polyphase filter for millimeter-wave quadrature LO generation," in IEEE Trans. Circuits Syst. II, vol. 60, No. 4, pp. 202-206, April 2013, is a technique that uses the polyphase filters for supplying a circuit for generation of the carrier signals LOI and LOQ. In particular, with an RC network like the one illustrated in FIG. 6*a*, it is possible to generate at output signals phase-shifted with respect to an input signal VIN.

More specifically, the circuit comprises four resistors R1, R2, R3 and R4, four capacitors C1, C2, C3, and C4, and four outputs O1, O2, O3, and O4. The input signal VIN is supplied to two nodes PA and PB that are common to two of the four branches. The four outputs O1, O2, O3, and O4 supply signals 90° phase-shifted with respect to one another, in particular, signals phase-shifted by 0°, 90°, 180°, and 270° with respect to the input signal VIN.

The resistors R1, R2, R3 and R4 and the capacitors C1, C2, C3, C4 are connected alternately in a loop configuration, and the input nodes PA and PB and the output nodes O1, O2, O3, and O4 are connected alternately to the respective node between the resistor and the capacitor in sequence. Alternatively, it is possible to use the technique described in R. Nonis, E. Palumbo, P. Palestri, and L. Selmi, "A design methodology for MOS current-mode logic frequency dividers," in IEEE Trans. Circuits Syst. I, vol. 54, No. 2, pp. 245-254, February 2007. In particular, in the technique described, an integer divider is used that divides the frequency of the input signal by an integer that is a multiple of two. For instance, a divider may be obtained with a connection of two or more flip-flops in cascade. By connecting a plurality of flip-flops in cascade at each output, a signal having a frequency that is half the previous one is obtained.

With reference to FIG. 6b, the signal fIN is sent at input to two flip-flops FF1 and FF2 connected in master-slave configuration. The signal fIN is connected to the clock inputs CK and $\overline{CK}$ of the two flip-flops. The first flip-flop FF1 has a data input D and an output Q, whereas the second flip-flop FF2 has a data input D and an output $\overline{Q}$ that is in quadrature (i.e., 90° phase-shifted) with respect to the output Q. The two outputs supply the desired in-phase and quadrature signals, for example, the first flip-flop FF1 returns the signal fOUT_Q and the second flip-flop FF2 returns the signal fOUT_I. The output Q of the first flip-flop FF1 is connected to the input D of the second flip-flop FF2, whereas the output $\overline{Q}$ of the second flip-flop FF2 is fed back to the input D of the first flip-flop FF1.

The output signals may have a frequency halved with respect to the input signal fIN and may be 90° phase-shifted with respect to one another. However, generators of in-phase and quadrature signals based upon polyphase filters are intrinsically narrow-band generators, unless higher-order filters are used, which would lead both to high losses and to a high energy consumption. Instead, a frequency divider in master-slave configuration is able to supply in-phase and quadrature signals over a wide range of frequencies. However, both of the approaches described above may not guarantee the precision required for the phase errors in the in-phase and quadrature signals I/Q. Moreover, other known systems are for obtaining in-phase and quadrature signals that are accurate with respect to process, voltage, and temperature (PVT) variations and that exploit feedback control systems that detect and correct the phase errors appropriately.

A few examples of the systems are described are: S. F. Gilling, "Circuit for generating signals in phase quadrature and associated method therefor", U.S. Pat. No. 5,375,258 to Gillig, Dec. 1994; A. Y. Valero-Lopez, S. T. Moon, and E. Sanchez-Sinencio, "Self-calibrated quadrature generator for WLAN multistandard frequency synthesizer," in IEEE J. Solid State Circuits, vol. 41, No. 5, pp. 1031-1041, May 2006; and—C. M. Ippolito, A. Italia, and G. Palmisano, "A CMOS auto-calibrated I/Q generator for Sub-GHz ultra low-power transceivers," in Proc. IEEE Radio Frequency Integrated Circuits (RFIC) Symp., pp. 319-322, June 2011.

For instance, the approach proposed in the '258 patent exploits a control loop that regulates the duty cycle of the carrier signal I to minimize the mean phase error at output from a divide-by-two circuit. Even though the above techniques may be simple and effective, they are, however, unable to guarantee in all cases the required precision.

For instance, in the technique referred to by Valero-Lopez, the phase error at output from a polyphase filter is compensated for by a multi-loop system, which exploits phase-shifters active for minimizing the phase error at output. The system supplies four output signals phase-shifted with respect to one another by 0°, 90°, 180°, and 270°, respectively. Phase control is provided by tuning three of the four output phases, for example, the outputs at 90°, 180°, and 270°, with respect to input phase, which is assumed as reference. This technique ensures a high precision in generation of in-phase and quadrature signals, but the control loops are markedly dependent, and require a sequential calibration technique for guaranteeing a stable operation of the entire system.

The above problem is overcome partially by the approach proposed by Ippolito, Italia, and Palmisano, which carries out the phase correction by circuits with resistive loads (source-coupled-logic—SCL—dividers and limiting amplifiers). To increase the precision, phase control is obtained by tuning both the time delay between the in-phase and quadrature signals I and Q and their duty cycles. Control of timing is carried out at the level of the divider by changing the load resistances of the divider and regulating the rising and falling edges of the in-phase and quadrature signals I and Q, whereas control of the duty cycle is carried out in the limiting amplifier by modifying the load resistances associated thereto. However, the control loops implemented in the latter technique described have a mutual second-order dependence, which may lead to a not altogether stable operation.

SUMMARY

In particular, a phase-correction circuit may comprise two circuits, which enable selective variation of the propagation delay of a rising edge and a falling edge.

For instance, in some embodiments, by jointly controlling, via the first circuit, the propagation delay of a rising edge and a falling edge of a first signal, such as, for example, the quadrature signal Q, the first circuit may be able to control the duty cycle of the first signal. Instead, by independently controlling, via the second circuit, the propagation delay of a rising edge and a falling edge of the other signal, such as, for example, the in-phase signal I, the second circuit may be able to control the phase shift between the two signals.

BRIEF DESCRIPTION OF THE DRAWINGS

FIGS. 3a-4 are diagrams of performance for circuits, according to the prior art;

FIGS. 8 and 11 are schematic circuit diagrams of embodiments of a circuit for controlling the phase error;

FIGS. 9a-9b and 10 are diagrams showing variations of the output signal in embodiments of a phase-error correction circuit, according to the present disclosure;

DETAILED DESCRIPTION

In the ensuing description, some specific details are illustrated aimed at providing an in-depth understanding of examples of one or more embodiments. The embodiments may be obtained without one or more of the specific details, or with other methods, components, materials, etc. In other cases, known structures, materials, or operations are not illustrated or described in detail so that some aspects of the embodiments will not be obscured. Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in various points of this description do not necessarily refer to the same embodiment. Furthermore, particular conformations, structures, or characteristics may be combined in any adequate way in one or more embodiments. The references used herein are provided merely for convenience and hence do not define the sphere of protection or the scope of the embodiments.

Figure 1:
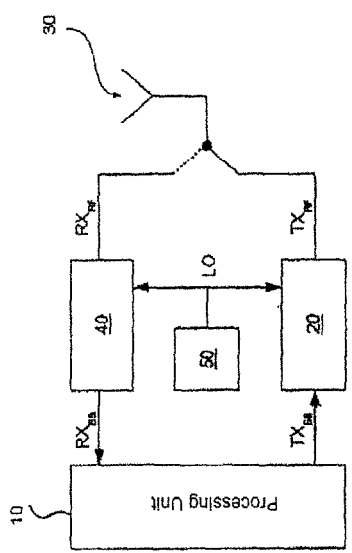
FIGS. 1-2 and 5 are schematic circuit diagrams of circuits, according to the prior art.
Figure 2:
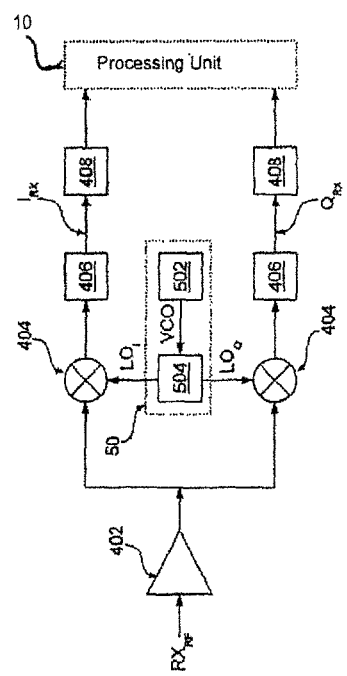
Figure 5:
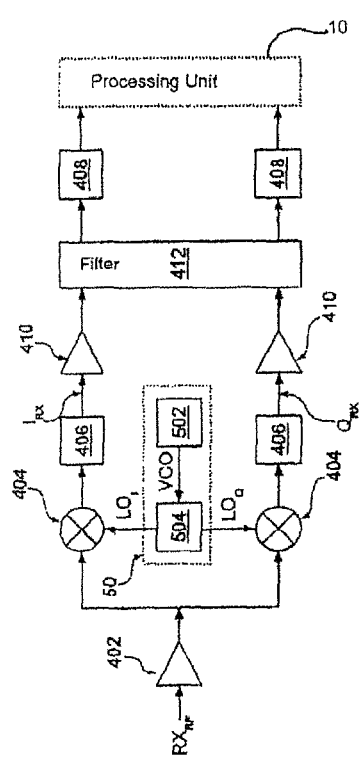
Figure 6A:
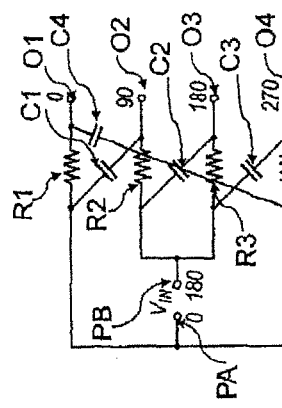
FIGS. 6a and 6b are schematic circuit diagrams of examples of open-loop circuits for generating in-phase and quadrature signals according to the present disclosure.
Figure 6B:
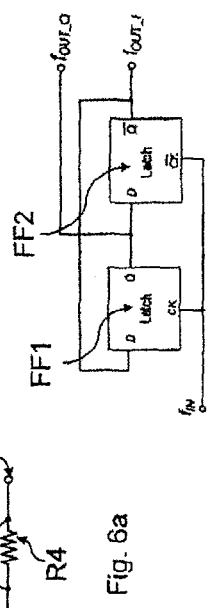

As mentioned previously, the present disclosure provides approaches for generating in-phase and quadrature signals to be used for example within a low-IF receiver. In the approach described herein, the phase error may be present in the in-phase and quadrature signals supplied at output from a conventional open-loop generator of in-phase and quadrature signals (see, for example, FIGS. 6a and 6b) is corrected via a correction circuit that exploits a feedback loop. In particular, in some embodiments, the phase-correction circuit comprises two circuits, which enable selective variation of the propagation delay of a rising edge and a falling edge. For instance, as will be described hereinafter, these circuits may comprise a current-controlled limiting amplifier. In this case, the feedback loop may comprise a circuit that varies the propagation delays of these two circuits in such a way as to obtain accurate and precise in-phase and quadrature signals at output.

Figure 7:
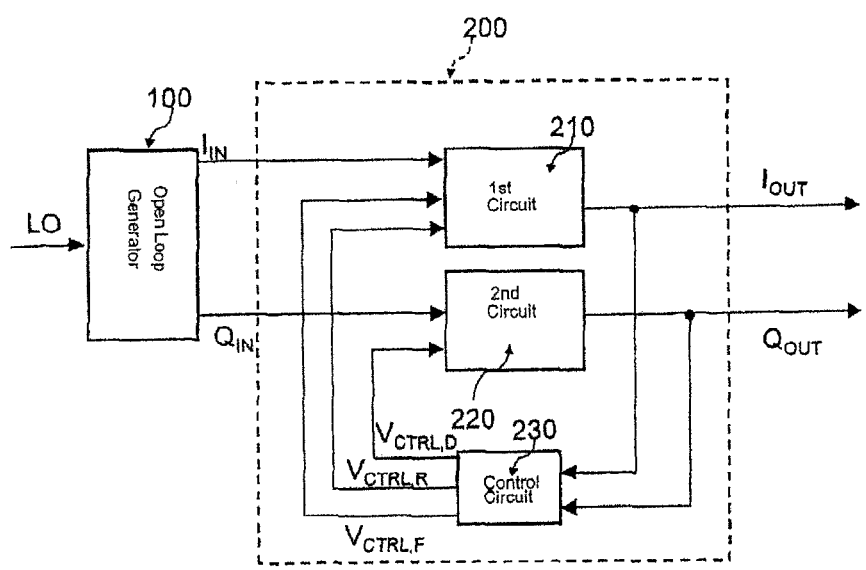
FIG. 7 is a schematic block diagram of an approach for generating in-phase and quadrature signals, according to the present disclosure.

An example of system according to the present disclosure is illustrated in FIG. 7. Designated as a whole by the reference 100 is a generic open-loop generator of in-phase and quadrature signals. This module 100 receives at input a carrier signal I having, for example, a frequency of between hundreds of Megahertz and a few Gigahertz and supplies at output two signals IIN and QIN, which are supplied at an input to a module 200 that corresponds to the phase-correction circuit.

In the embodiment illustrated, the phase-correction circuit 200 comprises two circuits 210 and 220, which enable selective variation of the propagation delay of a rising edge and a falling edge, and a control circuit 230. In particular, in the embodiment, the control circuit 230 controls these propagation delays in such a way as to regulate: a) the duty cycle of a first signal to obtain substantially a duty cycle of 50%; and b) the rising edge and the falling edge of the other signal for correcting the phase shift between the two signals, i.e., to obtain substantially a 90° phase shift.

For instance, in the illustrated embodiment, the in-phase signal IIN is supplied at input on a first branch to the first circuit 210. Likewise, the quadrature signal QIN is supplied at input on a second branch to the second circuit 220. The outputs IOUT and QOUT of the two circuits 210 and 220, which represent the desired in-phase and quadrature signals I and Q, are supplied at input to the control circuit 230 that carries out feedback control. This feedback control circuit 230 returns the signals for controlling the propagation delays of the circuits 210 and 220.

For instance, the control circuit 230 can supply at output three signals VCTRL,D, VCTRL,R and VCTRL,F, which are then fed back at input to the two circuits 210 and 220. In particular, VCTRL,D represents the signal that corrects the duty cycle of the quadrature signal Q. Whereas VCTRL,R represents the signal that monitors and corrects the difference between the rising edges of the signals I and Q by acting on the signal I, without modifying the difference between the falling edges, and VCTRL,F represents the signal that monitors and corrects the difference between the falling edges of the signals I and Q by acting on the signal I, without modifying the difference between the rising edges.

In some embodiments, the first signal VCTRL,D at output from the circuit 230 is fed back at input to the circuit 220 for correction of the duty cycle of the quadrature signal Q. Whereas the two signals VCTRL,R and VCTRL,F are fed back at input to the first circuit 210 for correction of the rising and falling edges of the in-phase signal I.

In particular, the approach disclosed enables in-phase and quadrature signals IOUT and QOUT with a correct phase to be obtained by correcting, for example, the duty cycle of the quadrature signal Q, and the rising edge and falling edge of the in-phase signal I. Alternatively, these two signals may also be swapped, i.e. it is possible to correct the duty cycle of the in-phase signal I and the rising edge and falling edge of the quadrature signal Q.

FIG. 8 shows a possible embodiment of each of the two circuits 210 and 220 that enable control of the propagation delays of a rising edge and a falling edge of a signal. Entering into the specifics of the circuit 210 or 220, the latter is based on a self-biased architecture that enables shifting of the rising edge of the output signal (VφOUT) irrespective of its falling edge, and vice versa.

With reference to FIG. 8, the circuit is based upon a current-controlled limiting amplifier. In particular, in the illustrated embodiment, the circuit receives at input the signal Vφ, such as, for example, the in-phase signal I or the quadrature signal Q, and supplies at output a delayed signal VφOUT.

The circuit further comprises a CMOS output stage and two current generators IB1 and IB2, such as, for example, voltage-controlled current generators. In particular, the output stage comprises two transistors M10 and M8 connected between the supply voltage VDD and ground GND. In particular, the transistor M10, for example, a P-MOS transistor, is connected between the voltage VDD and the output VφOUT, and the transistor M8, for example, an N-MOS transistor, is connected between the output VφOUT and ground GND. As is known, N-MOS and P-MOS transistors are field-effect transistors with a N-channel or P-channel metal-oxide-semiconductor junction.

In the illustrated embodiment, the circuit is configured for selective connection, by one or more current mirrors, of the current generator IB1 to the transistor M8 and selective connection of the current generator IB2 to the transistor M10. In particular, the current generators IB1 and IB2 are connected to the output stage according to the signal Vφ. In particular, the input signal Vφ may be a square-wave signal in which the current generator IB1 is connected to the transistor M8 when the signal Vφ corresponds to the high levels of the wave (i.e. to the voltage level corresponding to the logic value "1"). Whereas the current generator IB2 is connected to the transistor M10 when the signal Vφ corresponds to the low levels of the enabling wave, which corresponds to the high levels of the enabling wave of the inverted signal $\overline{V}_\phi$ (i.e. to the voltage level corresponding to the logic value "0"). For instance, in this embodiment, a signal $\overline{V}_\phi$ is used for this purpose that corresponds to the signal Vφ inverted.

For instance, in this embodiment, the circuit comprises two branches A and B connected along a path between the supply voltage VDD and the ground reference. In particular, the first branch A comprises a transistor M1 of an N-MOS type connected to the current generator IB1 that enables imposition of the current supplied by the generator IB1 in the first branch A when the transistor M1 is enabled. For instance, in this embodiment, this transistor M1 is enabled via the signal Vφ. Associated with the branch A, there may be a protection branch that allows a flow of current in the case where the transistor M1 is disabled. For instance, a transistor M2 of an N-MOS type is provided, connected to the current generator IB1, which is driven via the signal $\nabla_\phi$. Consequently, in this case, the current supplied via the generator IB1 traverses the transistor M1 or M2 according to the signal V$\phi$.

Here, the current that traverses the transistor M1 is transferred through one or more current mirrors to the transistor M8. For instance, in this embodiment, the two source terminals of the transistors M1 and M2 are connected to the biasing-current generator IB1, whereas the two gate terminals receive the enabling signal V$\phi$ (gate of M1) and the inverted signal $\nabla_\phi$ (gate of M2), respectively, at an input. Finally, the drain terminal of the transistor M2 is directly connected to the supply voltage VDD, whereas the drain terminal of the transistor M1 drives one or more current mirrors. For instance, provided in the embodiment are two current mirrors: a first current mirror comprising two transistors M5 and M6 of a P-MOS type, and a second current mirror comprising a transistor M7 of an N-MOS type and the output transistor M8.

Likewise, the branch B comprises a transistor M4 of an N-MOS type connected to the current generator IB2, which enables imposition of the current supplied by the generator IB2 in the first branch B when the transistor M4 is enabled. For instance, in this embodiment, this transistor M4 is enabled via the signal $\nabla_\phi$. Also in this case, the branch B can have associated therewith a protection branch that allows a flow of current in the case where the transistor M4 is disabled. For instance, in the embodiment considered, a transistor M3 of an N-MOS type is provided, connected to the current generator IB2, which is driven via the signal V$\phi$. Consequently, in this case, the current supplied via the generator IB2 traverses the transistor M3 or M4 according to the signal V$\phi$ or else its inverted version $\nabla_\phi$. Instead, in this case, the current that traverses the transistor M4 is transferred to the transistor M10 through one or more current mirrors.

For instance, the two source terminals of the transistors M3 and M4 are connected to the biasing-current generator IB2, whereas the two gate terminals receive the enabling signal V$\phi$ (gate of M3) and the inverted signal $\nabla_\phi$(gate of M4), respectively, at an input. Finally, the drain terminal of the transistor M3 is directly connected to the supply voltage VDD, whereas the drain terminal of the transistor M4 drives one or more current mirrors. For instance, a single current mirror, comprising a transistor M9 of the P-MOS type and the output transistor M10, is sufficient.

Consequently, when the first branch A is enabled (and the second branch B remains disabled), the transistor M1 enters into conduction, whereas the protection transistor M2 is open, and the current that flows in the circuit is set by the biasing-current generator IB1 and is supplied at output via two current mirrors. In the very next cycle, the first branch A is disabled and the second branch B enters into conduction. In particular, the transistor M4 enters into conduction, whereas the protection transistor M3 is open, and the current that flows in the circuit is set by the biasing-current generator IB2 and is supplied at output via a single current mirror made up of the transistors M9 and M10 of a P-MOS type.

Consequently, since the circuit comprises parasitic capacitances, the switching of the transistors M8 and M10 depend upon the currents IB1 and IB2. Hence, by setting the values of the biasing currents IB1 and IB2, it is possible to set the propagation delays of the rising edge and of the falling edge of the signal V$\phi$, respectively.

In particular, with reference to FIGS. 9a and 9b, in the case of a constant biasing current IB1, as the current IB2 increases, the rising edge of the output signal V$\phi$OUT is anticipated (i.e. it is shifted to the left), and likewise, in the case of constant biasing current IB2, as the current IB1 increases, the falling edge of the output signal V$\phi$OUT is anticipated (i.e. it is shifted to the left).

Furthermore, as shown in FIGS. 9a and 9b, control of the rising edge and control of the falling edge of the output signal V$\phi$OUT can be carried out independently of one another. This behavior can be used for correcting the phase error between the in-phase and quadrature signals. For instance, as explained previously, the phase-correction circuit 200 may comprise two distinct branches, present on which are the circuits 210 and 220 and which receive respectively at input the in-phase signal IIN and the quadrature signal QIN that are available at output from a circuit for generating in-phase and quadrature signals 100. For instance, the first circuit 210 works on the in-phase signal IIN so that the output signals IOUT and QOUT are phase shifted by 90°. Instead, the circuit 220 works on the quadrature signal QIN, and by jointly setting the propagation delays of the rising and falling edges, enables control of the duty cycle of the output signal QOUT. For instance, with the circuit shown in FIG. 8, the duty cycle can be varied by acting on the difference of the currents IB2 and IB1, i.e. IBD=IB2−IB1, maintaining the sum of the currents IB2 and IB1 constant, i.e. IBS=IB1+IB2.

Figure 10:
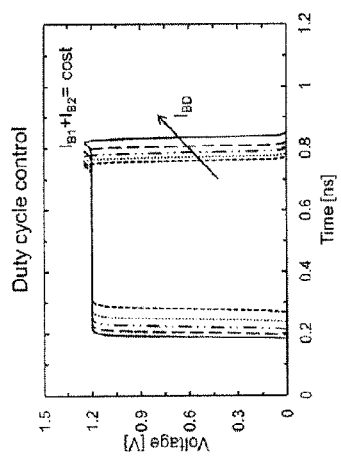

With reference to FIG. 10, as the current difference IBD increases, the falling edge of the output signal V$\phi$OUT is delayed (i.e. it is shifted to the right), and simultaneously the rising edge of the output signal V$\phi$OUT is anticipated (i.e., it is shifted to the left), thus increasing the duty cycle.

Figure 11:
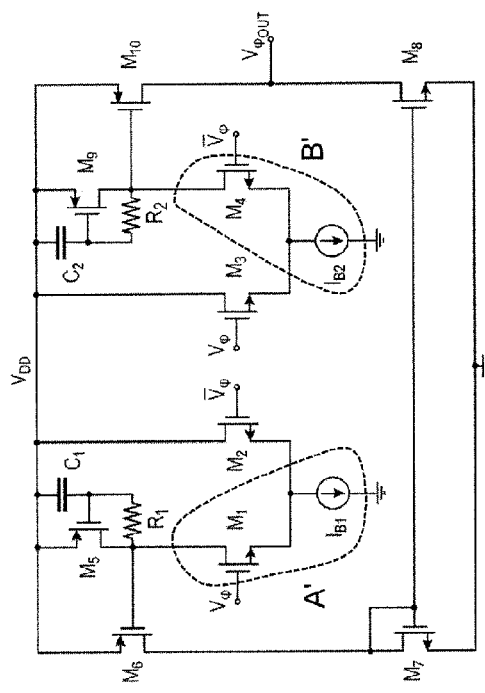

An alternative embodiment of the blocks 210 and 220 described above is illustrated in FIG. 11. In particular, in this embodiment, in the branches A' and B', two elements have been added, in particular, the capacitor C1 and the resistor R1 in the branch A' and the capacitor C2 and the resistor R2 in the branch B', in which the resistors R1 and R2 can be implemented, for example, by exploiting the P-MOS transistors in triode configuration. This embodiment exploits the local feedback supplied by the resistor elements R1 and R2 to increase the small-signal gain of the limiting amplifier.

Without affecting the dependence of the propagation delays of the falling and rising edges of the signal W upon the currents IB1 and IB2, respectively, the increase of gain enables, in this embodiment, switching of the transistors M8 and M10 with an enabling signal V$\phi$ that is of smaller amplitude than is required in the embodiment represented in FIG. 8. This in general results in a current saving, since the block 100 is required to generate lower signal levels in order to drive block 200 properly.

Figure 12:
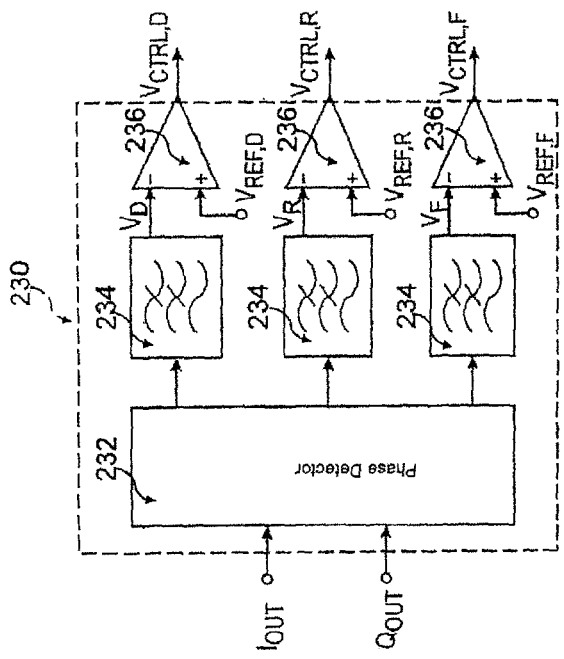
FIG. 12 is a schematic circuit diagram of the feedback control circuit.

In some embodiments of the phase-correction circuit proposed, the circuit in the quadrature path (block 220) is used for setting a duty cycle of 50% in the output signal QOUT. Instead, the circuit in the in-phase path (block 210) is used for controlling the delay time between both of the rising edges and falling edges of the output signals TOUT and QOUT. In this context, FIG. 12 shows a possible embodiment of the control circuit 230.

In this embodiment, the control feedback circuit 230 comprises, for example, a phase detector 232 and three low pass filters 234, which supply at output a feedback signal (VD, VR and VF) for each variable controlled (Duty cycle, Rising edge, Falling edge). Specifically, the signal VD for control of the duty cycle of the signal QOUT, may, for example, be obtained by acquiring the DC component of the signal, whereas the signals VR and VF, respectively, for control of the delays between the rising and falling edges of the output signals IOUT and QOUT, may, for example, be obtained using the known circuits based upon logic gates typically used for implementing phase detectors in PLLs.

The feedback signals are each compared with the corresponding reference voltage (VREF,D, VREF,R, and VREF, F) by a respective error amplifier 236 to generate the respective control signals VCTRL,D, VCTRL,R, and VCTRL,F for controlling the corresponding circuit 210 and 220. Regarding the circuit 220, the signal VCTRL,D may, for example, be converted, via a transconductor, into the differential current IBD that controls the duty cycle of the output signal, according to what has been described above. The phase detector 232 and the error amplifier 236 introduce a residual phase error between the output signals IOUT and QOUT, which, together with the phase error in the I/Q paths of the receiver, can be calibrated by varying the reference voltages of the loop circuits for regulation of the rising and falling edges, namely VREF,R and VREF,F.

Figure 13:
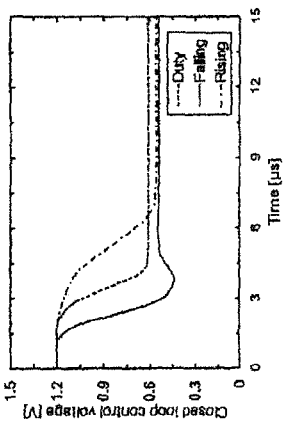
FIG. 13 is a diagram of the transient response of the control voltages of the system for generating in-phase and quadrature signals, according to the present disclosure.

FIG. 13 shows a possible transient response of the control voltages of the system for generating in-phase and quadrature signals. As is evident, completely stable operation may be guaranteed thanks to the independence of the control loops used.

Finally, the approach described herein is intrinsically a wide-band one and is consequently suitable for low-consumption implementations. Of course, the details of construction and the embodiments may vary, even significantly, with respect to what has been illustrated herein purely by way of non-limiting example, without thereby departing from the sphere of protection, as defined by the annexed claims.

That which is claimed is:

1. A system for correction of phase error in first and second square-wave input signals, the system comprising:
   a first circuit configured to receive the first square-wave input signal; and
   a second circuit configured to receive the second square-wave input signal, each of said first and second circuits configured to
      receive a respective one of the first and second square-wave input signals,
      supply a square-wave output signal, the square-wave output signal being delayed with respect to the respective one of the first and second square-wave input signals, and
      generate a configurable propagation delay of a rising edge, and a configurable propagation delay of a falling edge between the respective one of the first and second square-wave input signals and the square-wave output signal; and
   a control circuit configured to
      detect a duty cycle in the square-wave output signal of said second circuit,
      jointly set the configurable propagation delay of the rising edge and the configurable propagation delay of the falling edge of said second circuit as a function of the duty cycle,
      detect a phase shift between the square-wave output signal of said first circuit and the square-wave output signal of said second circuit, and
      set the configurable propagation delay of the rising edge and the configurable propagation delay of the falling edge of said first circuit as a function of the phase shift by at least
         correcting a difference between rising edges of the square-wave output signals of said first and second circuits, acting on the square-wave output signal of said first circuit without modifying a difference between falling edges of the square-wave output signals of said first and second circuits, and
         correcting a difference between falling edges of the square-wave output signals of said first and second circuits, acting on the square-wave output signal of said first circuit without modifying a difference between rising edges of the square-wave output signals of said first and second circuits.

2. The system according to claim 1 wherein said control circuit is configured to supply a first control signal, a second control signal, and a third control signal; wherein the first, second, and third control signals are fed back to said second circuit and said first circuit; wherein the first control signal corrects the duty cycle of the square-wave output signal of said second circuit; wherein the second control signal monitors and corrects the difference between rising edges of the square-wave output signals of said first and second circuits; and wherein the third control signal monitors and corrects the difference between the falling edges of the square-wave output signals of said first and second circuits.

3. The system according to claim 1 wherein said first circuit and said second circuit each comprises:
   a current-controlled limiting amplifier;
   a first input stage, and a second input stage configured to receive the respective one of the first and second square-wave input signals;
   an output stage comprising a first transistor, and a second transistor coupled between a supply voltage and a reference node; and
   first and second current generators, at least one of said first current generator and said second current generator being configured to be selectively coupled to said output stage as a function of the respective one of the first and second square-wave input signals.

4. The system according to claim 3 wherein each of said first and second circuits is configured to:
   couple, using at least one current mirror, said first current generator selectively to said second transistor of said output stage; and
   couple said second current generator selectively to said first transistor of said output stage, said first current generator and said second current generator each comprising voltage-controlled current generators.

5. The system according to claim 3 wherein said first transistor of said output stage comprises a first conductivity type transistor coupled between the supply voltage, and an output node configured to output the square-wave output signal; and wherein said second transistor of said output stage comprises a second conductivity type transistor coupled between said output node configured to output the square-wave output signal, and the reference node.

6. The system according to claim 3 wherein said first input stage comprises:
   a first input transistor of a first conductivity type coupled to said first current generator, said first input transistor configured to be enabled via the respective one of the first and second square-wave input signals, and
   a first protection transistor configured to allow a current when said first input transistor is disabled;
   said first protection transistor of the first conductivity type coupled to said first current generator, and configured to be enabled via an inverted square-wave input signal.

7. The system according to claim 6 wherein said second input stage comprises:
a second input transistor of the first conductivity type coupled to said second current generator and is configured to be enabled via the inverted square-wave input signal; and
a second protection transistor of the first conductivity type being coupled to said second current generator and configured to
allow a current when said second input transistor is disabled, and
be enabled via the respective one of the first and second square-wave input signals.

8. The system according to claim 3 wherein by setting biasing currents of said first current generator and said second current generator in said first circuit and said second circuit to set the configurable propagation delays of the rising edge and of the falling edge of the respective one of the first and second square-wave input signals, respectively.

9. The system according to claim 3 wherein said second circuit is configured to generate an output signal with a duty cycle being varied based upon on a difference of currents of said first current generator and said second current generator; and wherein a sum of currents of said first current generator and said second current generator are constant.

10. The system according to claim 2 wherein said control circuit comprises:
a phase detector; and
first, second, and third low pass filters coupled to said phase detector and each configured to supply a feedback signal for a respective controlled variable; and
first, second, and third error amplifiers respectively coupled to said first, second, and third low pass filters and configured to
compare each feedback signal with a corresponding reference voltage, and
generate, respectively, the first control signal, the second control signal, and the third control signal to control said first circuit and said second circuit.

11. A receiver system comprising:
a receiver circuit; and
a phase-error correction circuit coupled to said receiver circuit for correction of phase error in in-phase (I) and quadrature (Q) signals, said phase-error correction circuit comprising
a first circuit configured to receive the I signal, and
a second circuit configured to receive the Q signal, each of said first and second circuits configured to
receive a square-wave input signal,
supply a square-wave output signal, the square-wave output signal being delayed with respect to the square-wave input signal, and
generate a configurable propagation delay of a rising edge, and a configurable propagation delay of a falling edge between the square-wave input signal and the square-wave output signal, and a control circuit configured to
detect a duty cycle in the square-wave output signal of said second circuit,
jointly set the configurable propagation delay of the rising edge and the configurable propagation delay of the falling edge of said second circuit as a function of the duty cycle,
detect a phase shift between the square-wave output signal of said first circuit and the square-wave output signal of said second circuit, and set the configurable propagation delay of the rising edge and the configurable propagation delay of the falling edge of said first circuit as a function of the phase shift by at least
correcting a difference between rising edges of the square-wave output signals of said first and second circuits, acting on the square-wave output signal of said first circuit without modifying a difference between falling edges of the square-wave output signals of said first and second circuits, and
correcting a difference between falling edges of the square-wave output signals of said first and second circuits, acting on the square-wave output signal of said first circuit without modifying a difference between rising edges of the square-wave output signals of said first and second circuits.

12. The receiver system according to claim 11 wherein said phase-error correction system is configured to vary coefficients of the first circuit and of the second circuit to correct the phase errors between the I and Q signals; and wherein said receiver circuit is a receiver of the low-intermediate frequency type.

13. The receiver system according to claim 11 wherein said control circuit is configured to supply a first control signal, a second control signal, and a third control signal; wherein the first, second, and third control signals are fed back to said second circuit and said first circuit; wherein the first control signal corrects the duty cycle of the square-wave output signal of said second circuit; wherein the second control signal monitors and corrects the difference between rising edges of the square-wave output signals of said first and second circuits; and wherein the third control signal monitors and corrects the difference between the falling edges of the square-wave output signals of said first and second circuits.

14. The receiver system according to claim 11 wherein said first circuit and said second circuit each comprises:
a current-controlled limiting amplifier;
a first input stage, and a second input stage configured to receive the square-wave input signal;
an output stage comprising a first transistor, and a second transistor coupled between a supply voltage and a reference node; and
first and second current generators, at least one of said first current generator and said second current generator being configured to be selectively coupled to said output stage as a function of the square-wave input signal.

15. The receiver system according to claim 14 wherein each of said first and second circuits is configured to:
couple, using at least one current mirror, said first current generator selectively to said second transistor of said output stage; and
couple said second current generator selectively to said first transistor of said output stage, said first current generator and said second current generator each comprising voltage-controlled current generators.

16. A method for correction of phase error in first and second square-wave input signals, the method comprising:
operating a first circuit configured to receive the first square-wave input signal;
operating second circuit configured to receive the second square-wave input signal, each of the first and second circuits configured to receive a respective one of the first and second square-wave input signals, supply a square-wave output signal, the square-wave output signal being delayed with respect to the respective one of the first and second square-wave input signals, and generate a configurable propagation delay of a rising edge, and a configurable propagation delay of a falling edge between the respective one of the first and second square-wave input signals and the square-wave output signal; and operating a control circuit configured to detect a duty cycle in the square-wave output signal of the second circuit, jointly set the configurable propagation delay of the rising edge and the configurable propagation delay of the falling edge of the second circuit as a function of the duty cycle, detect a phase shift between the square-wave output signal of the first circuit and the square-wave output signal of the second circuit, and setting the configurable propagation delay of the rising edge and the configurable propagation delay of the falling edge of the first circuit as a function of the phase shift by at least correcting a difference between rising edges of the square-wave output signals of said first and second circuits, acting on the square-wave output signal of said first circuit without modifying a difference between falling edges of the square-wave output signals of said first and second circuits, and correcting a difference between falling edges of the square-wave output signals of said first and second circuits, acting on the square-wave output signal of said first circuit without modifying a difference between rising edges of the square-wave output signals of said first and second circuits.

17. The method according to claim 16 wherein the control circuit is configured to supply a first control signal, a second control signal, and a third control signal; wherein the first, second, and third control signals are fed back to the second circuit and the first circuit; wherein the first control signal corrects the duty cycle of the square-wave output signal of said second circuit; wherein the second control signal monitors and corrects the difference between rising edges of the square-wave output signals of said first and second circuits; and wherein the third control signal monitors and corrects the difference between the falling edges of the square-wave output signals of said first and second circuits.

18. The method according to claim 16 wherein the first circuit and the second circuit each comprises:

a current-controlled limiting amplifier;

a first input stage, and a second input stage configured to receive the respective one of the first and second square-wave input signals, an output stage comprising a first transistor, and a second transistor coupled between a supply voltage and a reference node; and first and second current generators, at least one of the first current generator and the second current generator being configured to be selectively coupled to the output stage as a function of the respective one of the first and second square-wave input signals.

19. The method according to claim 18 wherein each of the first and second circuits is configured to:

couple, using at least one current mirror, the first current generator selectively to the second transistor of the output stage; and couple the second current generator selectively to the first transistor of the output stage, the first current generator and the second current generator each comprising voltage-controlled current generators.

20. The method according to claim 18 wherein the first transistor of the output stage comprises a first conductivity type transistor coupled between the supply voltage, and an output node configured to output the square-wave output signal; and wherein the second transistor of the output stage comprises a second conductivity type transistor coupled between the output node configured to output the square-wave output signal, and the reference node.

21. A system for correction of phase error in first and second square-wave input signals, the system comprising:

a first circuit configured to receive the first square-wave input signal, and generate a first square-wave output signal, the first square-wave output signal being delayed with respect to the first square-wave input signal;

a second circuit configured to receive the second square-wave input signal, and generate a second square-wave output signal, the second square-wave output signal being delayed with respect to the second square-wave input signal; and a control circuit configured to set a configurable propagation delay of a rising edge and a configurable propagation delay of a falling edge of said second circuit as a function of a duty cycle of the second square-wave output signal, detect a phase shift between the first square-wave output signal the second square-wave output signal, and setting a configurable propagation delay of a rising edge and a configurable propagation delay of the falling edge of said first circuit as a function of the phase shift;

said first circuit and said second circuit each comprising a current-controlled limiting amplifier, a first input stage, and a second input stage configured to receive the respective one of the first and second square-wave input signals, an output stage comprising a first transistor, and a second transistor coupled between a supply voltage and a reference node, and first and second current generators, at least one of said first current generator and said second current generator being configured to be selectively coupled to said output stage as a function of the respective one of the first and second square-wave input signals, said first input stage comprising a first input transistor of a first conductivity type coupled to said first current generator, said first input transistor configured to be enabled via the respective one of the first and second square-wave input signals, and a first protection transistor configured to allow a current when said first input transistor is disabled, said first protection transistor being of the first conductivity type and coupled to said first current generator, and configured to be enabled via an inverted square-wave input signal.

22. The system according to claim 21 wherein each of said first and second circuits is configured to:

couple, using at least one current mirror, said first current generator selectively to said second transistor of said output stage; and couple said second current generator selectively to said first transistor of said output stage, said first current generator and said second current generator each comprising voltage-controlled current generators.

23. The system according to claim 21 wherein said first transistor of said output stage comprises a first conductivity type transistor coupled between the supply voltage, and an output node configured to output the square-wave output signal; and wherein said second transistor of said output stage comprises a second conductivity type transistor coupled between said output node configured to output the square-wave output signal, and the reference node.

* * * * *